United States Patent
Yamamoto et al.

(10) Patent No.: US 8,257,909 B2
(45) Date of Patent: *Sep. 4, 2012

(54) METHOD OF MANUFACTURING SEMICONDUCTOR DEVICE, AND METHOD OF FORMING RESIST PATTERN

(75) Inventors: Hajime Yamamoto, Kawasaki (JP); Satoshi Takechi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 920 days.

This patent is subject to a terminal disclaimer.

(21) Appl. No.: 10/647,247

(22) Filed: Aug. 26, 2003

(65) Prior Publication Data

US 2004/0043332 A1  Mar. 4, 2004

(30) Foreign Application Priority Data

Aug. 28, 2002 (JP) ................................. 2002-248379

(51) Int. Cl.
*G03F 7/26* (2006.01)
*G03F 7/40* (2006.01)
(52) U.S. Cl. ............ 430/313; 430/311; 430/273.1; 430/270.1; 430/314; 430/330
(58) Field of Classification Search .................. 430/314, 430/330
See application file for complete search history.

(56) References Cited

U.S. PATENT DOCUMENTS

| | | | | |
|---|---|---|---|---|
| 3,765,972 A | * | 10/1973 | Wesp | 156/71 |
| 3,912,450 A | * | 10/1975 | Boucher | 422/20 |
| 6,043,145 A | * | 3/2000 | Suzuki et al. | 438/622 |
| 6,555,617 B1 | * | 4/2003 | Tanaka et al. | 525/61 |
| 6,627,388 B2 | * | 9/2003 | Lin et al. | 430/315 |
| 6,753,117 B2 | * | 6/2004 | Lu | 430/30 |
| 6,818,384 B2 | * | 11/2004 | Choi et al. | 430/311 |
| 6,905,949 B2 | * | 6/2005 | Arita | 438/551 |
| 7,416,837 B2 | * | 8/2008 | Nozaki et al. | 430/314 |
| 2002/0012035 A1 | * | 1/2002 | Mouri et al. | 347/100 |
| 2003/0170571 A1 | * | 9/2003 | Nozaki et al. | 430/314 |

FOREIGN PATENT DOCUMENTS

| | | | |
|---|---|---|---|
| EP | 1152036 | * | 11/2001 |
| JP | 10-73927 | | 3/1998 |

* cited by examiner

*Primary Examiner* — Daborah Chacko Davis
(74) *Attorney, Agent, or Firm* — Westerman, Hattori, Daniels & Adrian, LLP

(57) ABSTRACT

The present invention provides a method of manufacturing a semiconductor device capable of highly detailed patterning using a resist pattern having smoothed wall surfaces and reduced roughness. The method includes the steps of: forming a resist pattern over a base layer; applying a resist pattern smoothing material onto a surface of the resist pattern, thereafter heating and developing; and etching the base layer using the smoothed resist pattern, wherein one of an application thickness and a heat temperature is adjusted so as to smooth at least wall surfaces of the resist pattern. Aspects in which a maximum opening dimension and a minimum opening dimension of the smoothed resist pattern are ±5% of a predetermined opening dimension D (nm), and an average opening dimension Dav. (nm) of the smoothed resist pattern satisfies Dav. (nm)≧D (nm)×(90/100), are preferable.

18 Claims, 5 Drawing Sheets

METHOD OF MANUFACTURING SEMICONDUCTOR DEVICE, AND METHOD OF FORMING RESIST PATTERN

CROSS-REFERENCE TO RELATED APPLICATIONS

This application is based upon and claims the benefits of the priority from the prior Japanese Patent Application No. 2002-248379, filed on Aug. 28, 2002, the entire contents of which are incorporated herein by reference.

BACKGROUND OF THE INVENTION

1. Field of the Invention

The present invention relates to a method of forming a resist pattern which can easily and efficiently form a smoothed resist pattern in which a surface, at least wall surfaces, thereof is reduced its surface roughness and then smoothed. The present invention also relates to a method of manufacturing a semiconductor device which can efficiently manufacture a high-performance semiconductor device by carrying out a highly detailed patterning using a smoothed resist pattern formed by the aforementioned method of forming a resist pattern.

2. Description of the Related Art

In forming an extremely fine pattern on a semiconductor integrated circuit, a lithography is an essential technique. The lithography is such technique that a resist film is applied on a substrate forming a thin film and is selectively exposed and developed so as to form a resist pattern, and dry etching is carried out using the resist pattern as a mask, and thereafter, the resist pattern is removed. Conventionally, ultraviolet radiation is used as a light source for the selective exposure in the lithography. However, as patterns have become increasingly finer, in recent years, an ArF Excimer laser, which has shorter wavelengths than ultraviolet radiation, has more commonly used as the light source for the selective exposure.

In exposure techniques using the ArF Excier laser as the light source for selective exposure, however, a problem arises in that it is not possible to use resist materials which the light source for patterning has longer wavelength than the ArF Excimer laser. Namely, such resist materials overly absorb the ArF Excimer laser and the light cannot be transmitted through these resist materials, such resist materials therefore do not function as resists when the ArF Excimer laser is utilized as the exposure light source. Accordingly, resist materials of novel compositions, mainly novel materials of adamantane and COMA, have been improved and used when an ArF Excimer laser is used in selective exposure. These novel materials have sufficient transmittance with respect to ArF Excimer laser light (whose wavelength is 193 nm).

When such novel materials are used, the patterning can be carried out using the ArF Excimer laser. However, a problem still arises in that the opening dimensions at the wall surface (edge portions) of the formed resist pattern, so-called edge roughness, become considerably varied. Namely, although pattern sizes have become more and more fine recently, the finer the pattern size becomes, the greater the proportion, in the entire resist extraction pattern, of roughness at the wall surfaces of the resist pattern. As a result, a problem arisen in that the opening dimensions become largely varied.

Here, methods have been proposed for obtaining resist patterns having reduced roughness at the surface thereof and a smoothed surface, by improving resist materials having small edge roughness or by making the resist pattern re-flow by heating after it has been formed. However, with such methods, there is the problem that deformation of the resist pattern and variations in the size of the resist pattern before and after the surface is smoothed are large.

SUMMARY OF THE INVENTION

An object of the present invention is to provide a method of forming a resist pattern capable of easily and efficiently forming a resist pattern having the smoothed wall surfaces, by applying a resist pattern smoothing material onto the surface of the resist pattern so as to smooth the wall surfaces of the resist pattern without resulting in great deformation of or great variations in the size of the resist pattern and without adversely affecting the resist pattern. Another object of the present invention is to provide an efficient method of manufacturing a high-performance semiconductor device by carrying out highly detailed patterning using a resist pattern which has been obtained by the aforementioned method of forming a resist pattern and whose wall surfaces have been smoothed.

A method of manufacturing a semiconductor device of the present invention comprises a step of forming a resist pattern over a base layer (this step may be referred as a "resist pattern forming step" hereinafter); a step of applying a resist pattern smoothing material onto a surface of the resist pattern, heating and developing the resist pattern applied with the resist pattern smoothing material so as to form a smoothed resist pattern (this step may be referred as a "resist pattern smoothing step" hereinafter); and a step of etching the base layer using the smoothed resist pattern as a mask so as to form a pattern of the base layer (this step may be referred as a "patterning step"). In the resist pattern smoothing step, at least one of an application thickness of the resist pattern smoothing material and a heat temperature for the heating is adjusted so as to smooth at least wall surfaces of the resist pattern.

In the method of manufacturing a semiconductor device of the present invention, in the resist pattern forming step, a resist pattern is formed over a base layer. Next, in the resist pattern smoothing step, a resist pattern smoothing material is applied onto the resist pattern, and then heated and developed. At this time, at least one of the thickness of the application and the temperature of the heating is adjusted. For example, when the resist pattern smoothing material is applied with a predetermined thickness on the surface of the resist pattern, between the surface of the resist pattern and the resist pattern smoothing material, a mixing layer is formed to the extent that the resist pattern is not thickened. Thereafter, the mixing layer is hardened by the heating. As a result, the edge roughness of the resist pattern is reduced and the surface of the resist pattern is smoothed, without great deformation of the resist pattern or variations in the size thereof.

Next, in the patterning step, by carrying out etching by using the smoothed resist pattern as a mask or the like, the base layer is patterned in great detail and has an extremely fine pattern. A high-performance semiconductor device is thereby efficiently manufactured.

The method of forming a resist pattern of the present invention comprises a step of applying a resist pattern smoothing material onto a surface of a resist pattern, heating and developing the resist pattern applied with the resist pattern smoothing material so as to form a smoothed resist pattern. In this step, at least one of an application thickness of the resist pattern smoothing material and a heat temperature for the heating is adjusted so as to smooth at least wall surfaces of the resist pattern.

In the method of forming a resist pattern of the present invention, after a resist pattern smoothing material is applied to the surface of the resist pattern, heating and developing are carried out. At this time, at least one of the thickness of the application and the temperature of the heating is adjusted. When the resist pattern smoothing material is applied with a predetermined thickness on the surface of the resist pattern, between the surface of the resist pattern and the resist pattern smoothing material, a mixing layer is formed to the extent that the resist pattern is not thickened. Thereafter, the mixing layer is hardened by the heating. As a result, the edge roughness of the resist pattern is reduced and the surface of the resist pattern is smoothed, without great deformation of the resist pattern or variations in the size thereof.

DESCRIPTION OF THE PREFERRED EMBODIMENTS

Method of Forming Resist Pattern

Figure 1:
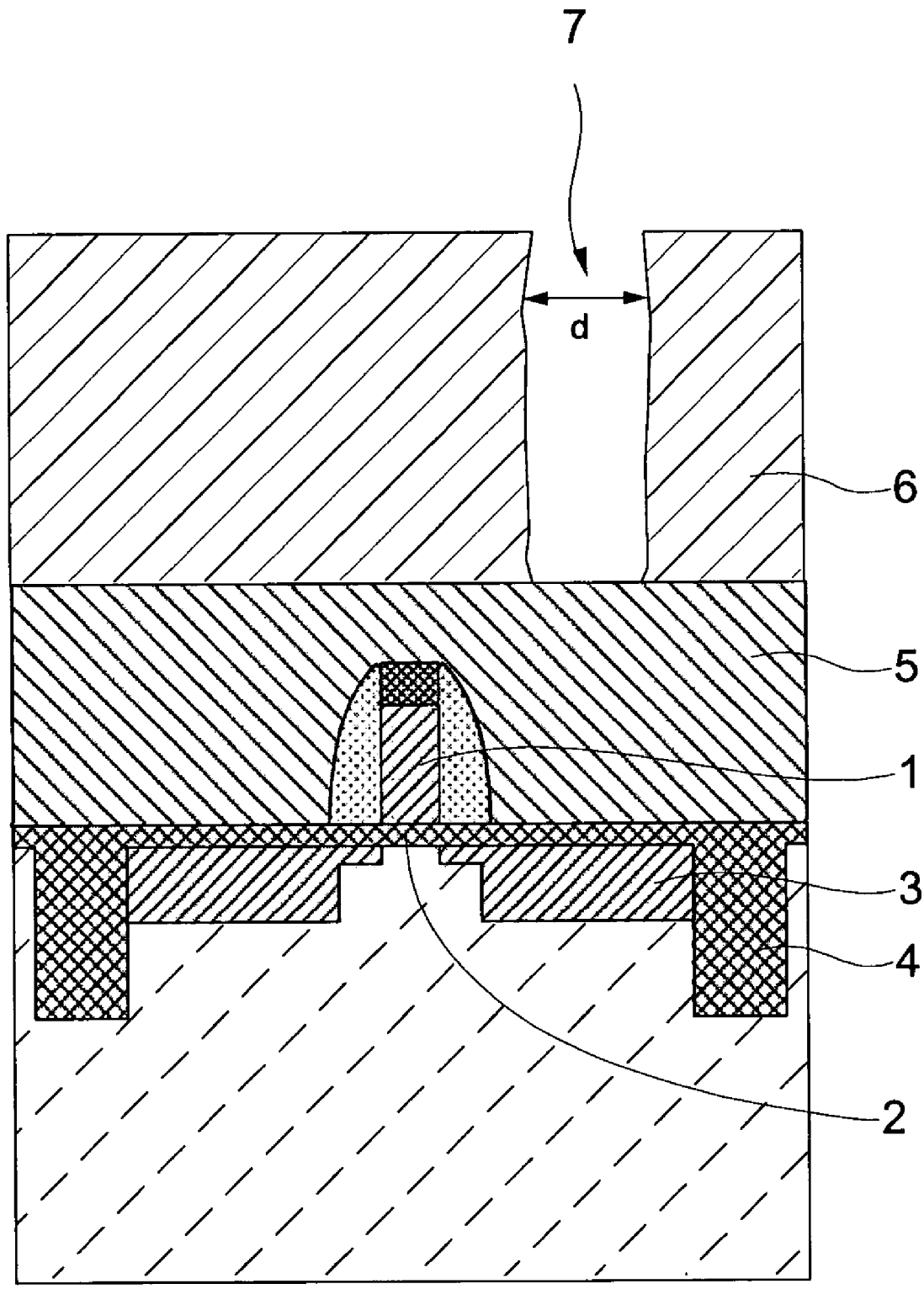
FIG. 1 is a schematic diagram for explaining an example of a resist pattern which is formed on an interlayer insulating film including a gate electrode, and whose surface has not been smoothed.

The method of forming the resist pattern of the present invention includes the step of applying a resist pattern smoothing material onto a surface of the resist pattern, thereafter heating and developing. The method may also include other steps which are appropriately selected in accordance with the object.

In the method of forming a resist pattern of the present invention, at least the wall surfaces of the resist pattern are smoothed by adjusting at least one of the processing conditions of the application thickness of the resist pattern smoothing material and the heat temperature for the heating, and further, if needed, by adjusting processing conditions such as the heating time, the composition and density of the resist pattern smoothing material, or the like.

In this way, a mixing layer is formed between the surface of the resist pattern and the resist pattern smoothing material, to the extent that the resist pattern is not thickened. Thereafter, the mixing layer is hardened by heating. As a result, the edge roughness of the resist pattern is reduced and the surface of the resist pattern is smoothed, without any great deformation or great variations in size arising at the resist pattern.

In the present invention, it is preferable that the processing conditions are selected within a range such that slight intermixing occurs between the resist pattern and the resist pattern smoothing material.

If no intermixing at all occurs, the effect of improving the edge roughness of the resist pattern may become insufficient, and a smoothed resist pattern may not be able to be obtained. On the other hand, if the reaction of the intermixing is excessive, the amount of change in the opening dimensions of the resist extraction pattern may become large, and control of the processing may be difficult to carry out only smoothing of the resist pattern without thickening the resist pattern. In addition, all of the resist pattern smoothing material applied onto the resist pattern may harden depending on the case, and then the pattern formed by the resist is filled over with the harden resist pattern smoothing material, and in the end, the resist pattern is disappeared.

By selecting the processing conditions within a range in which slight intermixing occurs, a wider processing margin can be ensured. Furthermore, it is possible to form a resist pattern in which the edge roughness is effectively reduced and is smoothed stably without thickening the resist pattern, and free from other causes of trouble, such as the resist pattern being buried, disappeared and the like. Moreover, an improvement in the produceability of high-performance semiconductor devices utilizing highly-detailed resist patterns can be expected, and the production of semiconductor devices to which even finer pattern size rules are applied is possible.

The material of the resist pattern is not particularly limited, and can be appropriately selected in accordance with the object. However, an ArF resist is particularly preferable when the preferable resist pattern smoothing materials which will be described later are used.

The ArF resist is not particularly limited, and can be appropriately selected from any known ArF resists in the art. Suitable examples are an acrylic resin having adamantane as a main component, a COMA resin, and the like.

The resist pattern may be a hole pattern, or a line-and-space pattern, and can be appropriately selected in accordance with the object. From the viewpoint of the effect of smoothing the wall surface of the resist pattern, the opening dimension (the diameter or the width) D is preferably about 50 nm to about 150 nm, and more preferably 100 nm to 120 nm.

The method of application is not particularly limited, and can be appropriately selected from any known application methods in the art in accordance with the object. Suitable examples are a spin coating method, and the like. When a spin coating method is used, examples of the conditions thereof are as follows: the rotational speed is about 100 rpm to about 10,000 rpm, and is preferably 800 rpm to 5000 rpm; and the application time is about 1 second to 10 minutes, and is preferably 1 second to 90 seconds.

The application thickness is not particularly limited, and can be appropriately selected in accordance with the object. From the viewpoint of efficiency when carrying out only smoothing of the resist pattern without thickening the resist pattern, the application thickness is, for example, preferably about 70 nm to about 100 nm, and more preferably 80 nm to 90 nm.

If the application thickness is less than 70 nm, the effect of reducing the edge roughness of the resist pattern may become insufficient, and it may not be possible to obtain a smoothed resist pattern. If the application thickness is more than 100 nm, the resist pattern may become too thick. If the application thickness is 150 nm or more, moreover, the resist pattern smoothing material may form crosslinks with the entire surface of the resist pattern, or the like.

The heat temperature for the heating is not particularly limited, and can be appropriately selected in accordance with the object. However, from the viewpoint of effectiveness when carrying out only smoothing of the resist pattern without thickening the resist pattern, a heat temperature of about 80° C. to about 100° C. is preferable, 90° C. to 100° C. is more preferable, and 95° C. to 100° C. is particularly preferable.

If the heat temperature is less than 80° C., the effect of reducing the edge roughness of the resist pattern may be insufficient, and it may not be possible to obtain a smoothed resist pattern. If the heat temperature is more than 100° C., the resist pattern smoothing material may form crosslinks with the entire surface of the resist pattern, or the like.

The temperature of the heating is closely linked to the heating time. Generally, when the heat temperature is low, it is preferable to make the heating time longer, and conversely, when the heat temperature is high, it is preferable to make the heating time shorter. By applying a given amount of heat or thermal energy to the resist pattern and the resist pattern smoothing material which has been applied to and is contacting the resist pattern, it is possible to efficiently carry out only smoothing of the resist pattern without thickening the resist pattern.

The heating time is usually about 10 seconds to about 240 seconds, and preferably about 30 seconds to about 120 seconds.

Due to the aforementioned heating, the mixing layer, which is formed by intermixing between the resist pattern and the resist pattern smoothing material, is crosslinked. Thus, this processing of heating may be called "crosslinking baking", "baking", and the like.

The developing may be water developing, or alkali developing which is carried out by an alkaline aqueous solution. However, from the viewpoint of efficiency and cost effectiveness of the developing processing, water developing is preferable. Further, although the amount of shrinkage of the opening dimension of the pattern differs in water developing and alkali developing, this can be adjusted by the baking temperature and the like.

Due to the developing, the portions, within the applied resist pattern smoothing material, which have not crosslinked with or only weakly crosslinked with the resist pattern (i.e., the portions having high water solubility) are dissolved and removed, and a smoothed resist pattern is developed.

In the present invention, given that the predetermined opening dimension of the resist pattern is D (nm), the maximum opening dimension Dmax (nm) and the minimum opening dimension Dmin (nm) of the smoothed resist pattern are, with respect to D (nm), within a range of ±5%, and more preferably within a range of ±3%.

When the maximum opening dimension Dmax (nm) and the minimum opening dimension Dmin (nm) fall outside of the range of ±5% of D (nm), it may not be possible to form a highly detailed resist pattern having excellent smoothness.

The maximum opening dimension Dmax (nm) and the minimum opening dimension Dmin (nm) can be measured by using, for example, a scanning electron microscope (SEM).

In the present invention, given that the predetermined opening dimension of the resist pattern is D (nm), an average opening dimension Dav. (nm) of the smoothed resist pattern preferably satisfies the formula of:

$$Dav. (nm) \geq D(nm) \times (90/100),$$

and more preferably satisfies the formula of:

$$Dav. (nm) \geq D(nm) \times (95/100).$$

If the relation between the predetermined opening dimension and the average opening dimension does not satisfy the formula of Dav. (nm)≧D (nm)×(90/100), the thickening of the resist pattern may overly progress, and it may not be possible to form a smoothed resist pattern in which only the edge roughness is reduced and the resist pattern is not thickened.

The average opening dimension Dav. (nm) can be measured by using, for example, a scanning electron microscope (SEM).

Resist Pattern Smoothing Material

The resist pattern smoothing material comprises a resin, a crosslinking agent, and a surfactant, and if needed, may further comprise an appropriately selected water-soluble aromatic compound, resin containing an aromatic compound in a portion thereof, organic solvent, and other components.

The resist pattern smoothing material is water-soluble or alkali-soluble.

The resist pattern smoothing material may be in any of aqueous solution form, colloid liquid form, emulsion liquid form, and the like, but an aqueous solution form is preferable.

The resin is not particularly limited, and may be appropriately selected in accordance with the object. However, the resin is preferably water-soluble or alkali-soluble. It is even more preferable that the resin either can generate crosslinks, or cannot generate crosslinks but can mix with a water-soluble crosslinking agent.

When the resin is a water-soluble resin, the water-soluble resin preferably exhibits a water solubility of 0.1 g or more thereof dissolving in water of 25° C.

Examples of water-soluble resins include polyvinyl alcohol, polyvinyl acetal, polyvinyl acetate, polyacrylate, polyvinyl pyrrolidone, polyethylene imine, polyethylene oxide, styrene-maleic acid copolymer, polyvinyl amine, polyaryl amine, oxazoline group containing water-soluble resins, water-soluble melamine resins, water-soluble urea resins, alkyd resins, sulfonamide resins, and the like.

When the resin is an alkali-soluble resin, the alkali-soluble resin preferably exhibits an alkali solubility of 0.1 g or more thereof dissolving in 2.38% tetramethyl ammonium hydroxide (TMAH) of 25° C.

Examples of alkali-soluble resins include novolak resins, vinylphenol resins, polyacrylate, polymethacrylate, poly p-hydroxyphenylacrylate, poly p-hydroxyphenylmethacrylate, copolymers thereof, and the like.

The aforementioned resins may be used singly, or in combination of two or more. Among these, polyvinyl alcohol, polyvinyl acetal, polyvinyl acetate, and the like are preferable.

The amount of the resin contained in the resist pattern smoothing material differs in accordance with the type and the amount and the like of the crosslinking agent, and cannot be stipulated unconditionally, and can be appropriately determined in accordance with the object.

The crosslinking agent is not particularly limited and can be appropriately selected in accordance with the object. However, water-soluble crosslinking agents which cause crosslinking by heat or an acid are preferable. Suitable examples are amine crosslinking agents.

Suitable examples of amine crosslinking agents are melamine derivatives, urea derivatives, uril derivatives and the like. These amine crosslinking agents may be used singly, or in combination of two or more.

Examples of urea derivatives include urea, alkoxymethylene urea, N-alkoxymethylene urea, ethylene urea, ethylene urea carboxylic acid, derivatives thereof, and the like.

Examples of melamine derivatives include alkoxymethyl melamine, derivatives thereof, and the like.

Examples of uril derivatives include benzoguanamine, glycol uril, derivatives thereof, and the like.

The amount of the crosslinking agent contained in the resist pattern smoothing material differs in accordance with the type and the contained amount and the like of the resin, and cannot be stipulated unconditionally, and can be appropriately determined in accordance with the object.

The surfactant is not particularly limited, and can be appropriately selected in accordance with the object. Examples include non-ionic surfactants, cationic surfactants, anionic surfactants, amphoteric surfactants, and the like. These surfactants may be used singly, or in combination of two or more. Among these, non-ionic surfactants are preferable as metal ions are not included therein.

Suitable examples of non-ionic surfactants include surfactants selected from alkoxylate surfactants, fatty acid ester surfactants, amide surfactants, alcohol surfactants, and ethylenediamene surfactants. Specific examples thereof include polyoxyethylene-polyoxypropylene condensation compounds, polyoxyalkylene alkylether compounds, polyoxyethylene alkylether compounds, polyoxyethylene derivative compounds, sorbitan fatty acid ester compounds, glycerin fatty acid ester compounds, primary alcohol ethoxylate compounds, phenol ethoxylate compounds, nonylphenol ethoxylate compounds, octylphenol ethoxylate compounds, lauryl alcohol ethoxylate compounds, oleyl alcohol ethoxylate compounds, fatty acid ester compounds, amide compounds, natural alcohol compounds, ethylene diamine compounds, and secondary alcohol ethoxylate compounds, and the like.

The cationic surfactant is not particularly limited and can be appropriately selected in accordance with the object. Examples include cationic alkyl compounds, cationic quaternary amide compounds, cationic quaternary ester compounds, and the like.

The amphoteric surfactant is not particularly limited and can be appropriately selected in accordance with the object. Examples include amine oxide compounds, betaine compounds, and the like.

The amount of the surfactant contained in the resist pattern smoothing material differs in accordance with the types and the contained amounts and the like of the resin, the crosslinking agent and the like, and cannot be stipulated unconditionally, and can be appropriately selected in accordance with the object.

From the viewpoint of markedly improving the etching resistance of the obtained resist pattern, the resist pattern smoothing material preferably contains a water-soluble aromatic compound.

The water-soluble aromatic compound is not particularly limited as long as it is an aromatic compound and exhibits water solubility, and can be appropriately selected in accordance with the object. However, water-soluble aromatic compounds exhibiting water solubility of 1 g or more thereof dissolving in 100 g of water of 25° C. are preferable, those exhibiting water solubility of 3 g or more thereof dissolving in 10 g of water of 25° C. are more preferable, and those exhibiting water solubility of 5 g or more thereof dissolving in 10 g of water of 25° C. are particularly preferable.

Examples of water-soluble aromatic compounds are polyphenol compounds, aromatic carboxylic acid compounds, naphthalene polyhydric alcohol compounds, benzophenone compounds, flavonoid compounds, porphin, water-soluble phenoxy resins, aromatic containing water-soluble dyes, derivatives thereof, glycoside thereof, and the like. These may be used singly, or in combination of two or more.

Examples of polyphenol compounds and derivatives thereof include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, resorcin, resorcin [4] arene, pyrogallol, gallic acid, derivatives thereof, glycosides thereof, and the like.

Examples of aromatic carboxylic acid compounds and derivatives thereof include salicylic acid, phthalic acid, dihydroxy benzoic acid, tannin, derivatives thereof, glycosides thereof, and the like.

Examples of naphthalene polyhydric alcohol compounds and derivatives thereof include naphthalene diol, naphthalene triol, derivatives thereof, glycosides thereof, and the like.

Examples of benzophenone compounds and derivatives thereof include alizarin yellow A, derivatives thereof, glycosides thereof, and the like.

Examples of flavonoid compounds and derivatives thereof include flavone, isoflavone, flavanol, flavonone, flavonol, flavan-3-ol, aurone, chalcone, dihydrochalcone, quercetin, derivatives thereof, glycosides thereof, and the like.

Among the aforementioned water-soluble aromatic compounds, from the viewpoint of excellent water solubility, those having two or more polar groups are preferable, those having three or more polar groups are more preferable, and those having four or more polar groups are particularly preferable.

The polar groups are not particularly limited, and may be appropriately selected in accordance with the object. Examples include hydroxyl groups, carboxyl groups, carbonyl groups, sulfonyl groups, and the like.

The amount of the water-soluble aromatic compound contained in the resist pattern smoothing material can be appropriately determined in accordance with the types and the contained amounts and the like of the resin, the crosslinking agent, and the like.

From the viewpoint of markedly improving the etching resistance of the obtained resist pattern, it is preferable that the resist pattern smoothing material contains a resin containing an aromatic compound in a portion thereof.

The resin containing an aromatic compound in a portion thereof is not particularly limited and can be appropriately selected in accordance with the object. However, those which can generate a crosslinks are preferable. Suitable examples include polyvinyl aryl acetal resins, polyvinyl aryl ether resins, polyvinyl aryl ester resins, and derivative thereof. It is preferable to use at least one type selected therefrom. From the viewpoint of exhibiting water solubility or alkali solubility to an appropriate degree, such a resin which contains an acetyl group is more preferable. These resins may be used singly, or in combination of two or more.

The polyvinyl aryl acetal resin is not particularly limited and may be appropriately selected in accordance with the object. Examples include β-resorcin acetal and the like.

The polyvinyl aryl ether resin is not particularly limited and may be appropriately selected in accordance with the object. Examples include 4-hydroxybenzyl ether and the like.

The polyvinyl aryl ester resin is not particularly limited and may be appropriately selected in accordance with the object. Examples include benzoic acid ester and the like.

The method of producing the polyvinyl aryl acetal resin is not particularly limited and may be appropriately selected in accordance with the object. A suitable example is a conventional method utilizing a polyvinyl acetal reaction, or the like. For instance, polyvinyl alcohol, and aldehyde in an amount needed stoichiometrically for the polyvinyl alcohol are made to undergo an acetalizing reaction under the presence of an acid catalyst. Specifically, suitable examples are the methods disclosed in U.S. Pat. Nos. 5,169,897 and 5,262,270, Japanese Patent Application Laid-Open (JP-A) No. 5-78414, and the like.

The method of producing the polyvinyl aryl ether resin is not particularly limited and may be appropriately selected in accordance with the object. Examples are a copolymerization reaction of a corresponding vinyl aryl ether monomer and vinyl acetate; an etherizing reaction of polyvinyl alcohol and an aromatic compound having a halogenated alkyl group in the presence of a basic catalyst (the ether synthesizing reaction of Williamson); and the like. Specifically, suitable examples are the methods disclosed in JP-A Nos. 2001-40086, 2001-181383, 6-116194, and the like.

The method of producing the polyvinyl aryl ester resin is not particularly limited and may be appropriately selected in accordance with the object. Examples are a copolymerization reaction of a corresponding vinyl aryl ester monomer and vinyl acetate; an esterizing reaction of polyvinyl alcohol and an aromatic carboxylic acid halide compound in the presence of a basic catalyst; and the like.

The aromatic compound in the resin containing an aromatic compound in a portion thereof is not particularly limited, and may be appropriately selected in accordance with the object. Suitable examples include monocyclic aromatic benzene derivatives, pyridine derivatives, and the like, and compounds in which a plurality of aromatic rings are connected (polycyclic aromatic compounds such as naphthalene, anthracene, and the like), and the like.

From the viewpoint of appropriate water solubility, the aromatic compound in the resin containing an aromatic compound in a portion thereof preferably contains at least one functional group such as a hydroxyl group, a cyano group, an alkoxyl group, a carboxyl group, an amino group, an amide group, an alkoxylcarbonyl group, a hydroxyalkyl group, a sulfonyl group, an acid anhydride group, a lactone group, a cyanate group, an isocyanate group, a ketone group, a succharic derivative thereof, and the like. It is more preferable for the aromatic compound to contain at least one functional group selected from a hydroxyl group, an amino group, a sulfonyl group, a carboxyl group, and a group of derivatives thereof.

The mol percentage content of the aromatic compound in the resin containing an aromatic compound in a portion thereof is not particularly limited as long as it does not affect the etching resistance, and can be appropriately selected in accordance with the object. However, when high etching resistance is required, the mol percentage content is preferably 5 mol % or more, and more preferably 10 mol % or more.

The mol percentage content of the aromatic compound in the resin containing an aromatic compound in a portion thereof can be, for example, measured by using NMR or the like.

The contained amount, in the resistance pattern smoothing material, of the resin containing an aromatic compound in a portion thereof, can be appropriately determined in accordance with the type, the content, and the like, of the resin, the crosslinking agent, and the like.

By making the resist pattern smoothing material contain the organic solvent, the solubility of the resin, the crosslinking agent and the like in the resist pattern smoothing material can be improved.

The organic solvent is not particularly limited, and can be appropriately selected in accordance with the object. Examples include alcohol organic solvents, chain ester organic solvents, cyclic ester organic solvents, ketone organic solvents, chain ether organic solvents, cyclic ether organic solvents and the like.

Examples of the alcohol organic solvents are methanol, ethanol, propyl alcohol, isopropyl alcohol, butyl alcohol, and the like.

Examples of the chain ester organic solvents are ethyl lactate, propylene glycol monomethyl ether acetate (PGMEA), and the like.

Examples of the cyclic ester organic solvents are lactone organic solvents such as γ-butyrolactone, and the like.

Examples of the ketone organic solvents are such as acetone, cyclohexanone, heptanone, and the like.

Examples of the chain ether organic solvents are ethylene glycol dimethylether, and the like.

Examples of the cyclic ether organic solvents are tetrahydrofuran, dioxane, and the like.

These organic solvents may be used singly, or in combination of two or more. Thereamong, organic solvents having a boiling point of around 80° C. to 200° C. are preferable from the viewpoint of carrying out smoothing finely.

The amount of the organic solvent content in the resist pattern smoothing material can be appropriately determined in accordance with the type, the content, and the like, of the resin, the crosslinking agent, the surfactant, and the like.

The other components are not particularly limited as long as they do not adversely affect the effects of the present invention, and can be appropriately selected in accordance with the object. Examples are various types of known additives in the art, such as thermal acid generators, quenchers such as an amine quencher, an amide quencher, an ammonium chlorine quencher, and the like.

The contained amount of the other components in the resist pattern smoothing material can be appropriately determined in accordance with the type, the content, and the like, of the resin, the crosslinking agent, and the like.

The resist pattern smoothing material can be used by being applied onto the resist pattern.

At the time of application, the surfactant may be applied before and separately from the application of the resist pattern smoothing material, so that the surfactant is not contained in the resist pattern smoothing material.

When the resist pattern smoothing material is applied onto the resist pattern, and heated and developed, the resist pattern is smoothed and then a smoothed resist pattern is formed.

A embodiment in which the resist pattern, which is formed as described above and whose wall surfaces are smoothed, contains at least one of the aromatic compound and the resin containing an aromatic compound in a portion thereof, is preferable from the viewpoint of excellent etching resistance and workability of a base layer. In this case, the contained amount of the at least one of the aromatic compound and the resin containing an aromatic compound in a portion thereof can be adjusted so as to gradually decrease from the surface toward the interior.

The resist pattern, which is formed as described above and whose wall surfaces are smoothed, can suitably be used in, for example, the manufacturing of functional parts such as mask patterns, reticle patterns, magnetic heads, LCDs (liquid crystal displays), PDPs (plasma display panels), SAW filters (surface acoustic wave filters), and the like; optical parts used in connecting optical wiring; fine parts such as microactuators and the like; semiconductors; and the like. The resist pattern can be particularly preferably used in the method of manufacturing a semiconductor device of the present invention which will be described hereinafter.

The method of forming the resist pattern of the present invention will be described hereinafter with reference to the figures.

As shown in FIG. 1, an active region "3" and an element separating region "4" are formed on a base layer (substrate). A gate oxide film "2" is formed on the surface thereof. A gate electrode "1" is formed thereon. A resist pattern "6" is formed so as to cover an interlayer insulating film "5" which is formed so as to cover the gate electrode 1. The resist pattern "6" has a hole pattern "7" (having opening dimension d).

Figure 2:
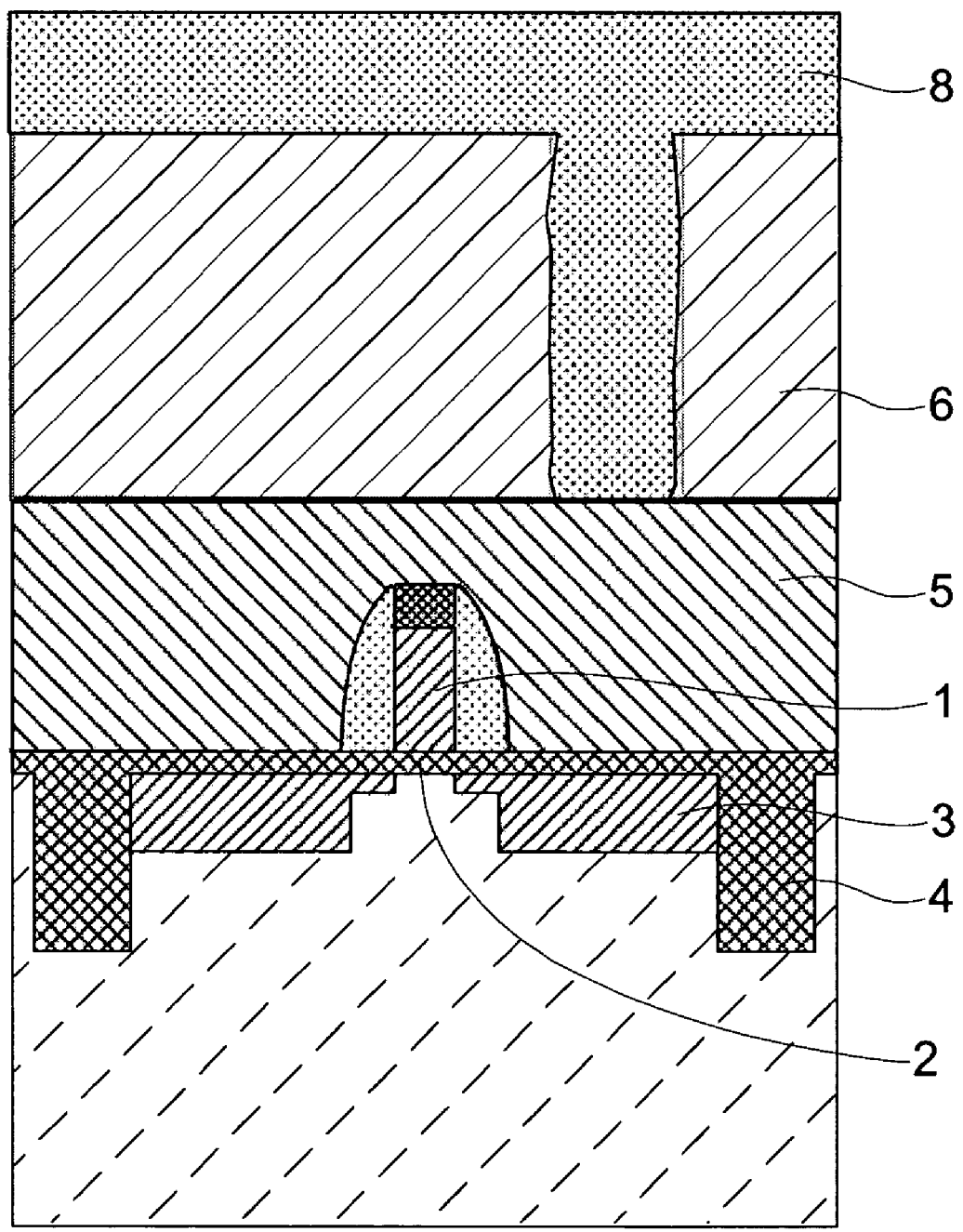
FIG. 2 is a schematic diagram for explaining an example of a state in which a resist pattern smoothing material is applied onto the resist pattern shown in FIG. 1.
Figure 3:
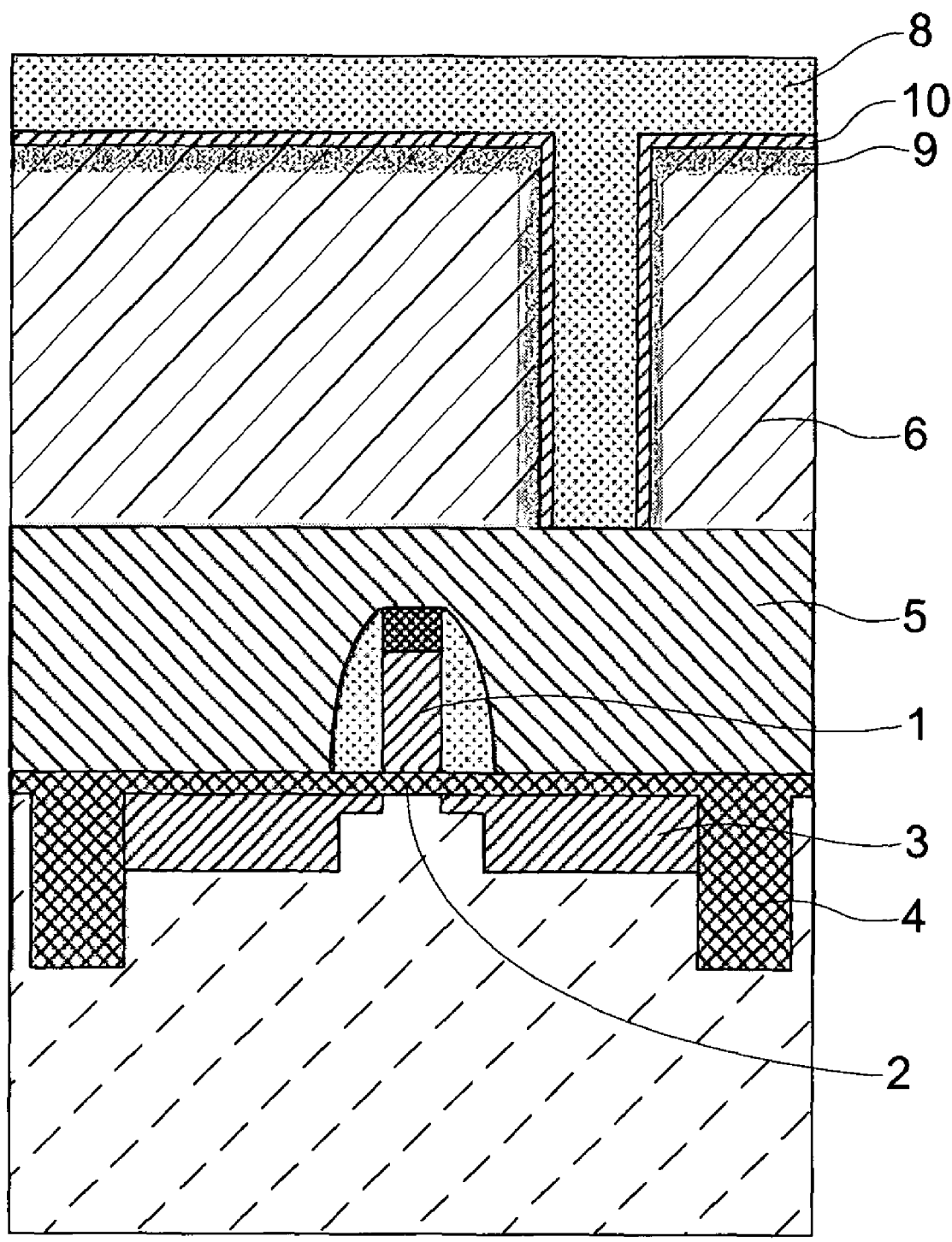
FIG. 3 is a schematic diagram for explaining an example of a state in which a mixing layer is formed at a boundary surface of the resist pattern and the resist pattern smoothing material shown in FIG. 2.
Figure 4:
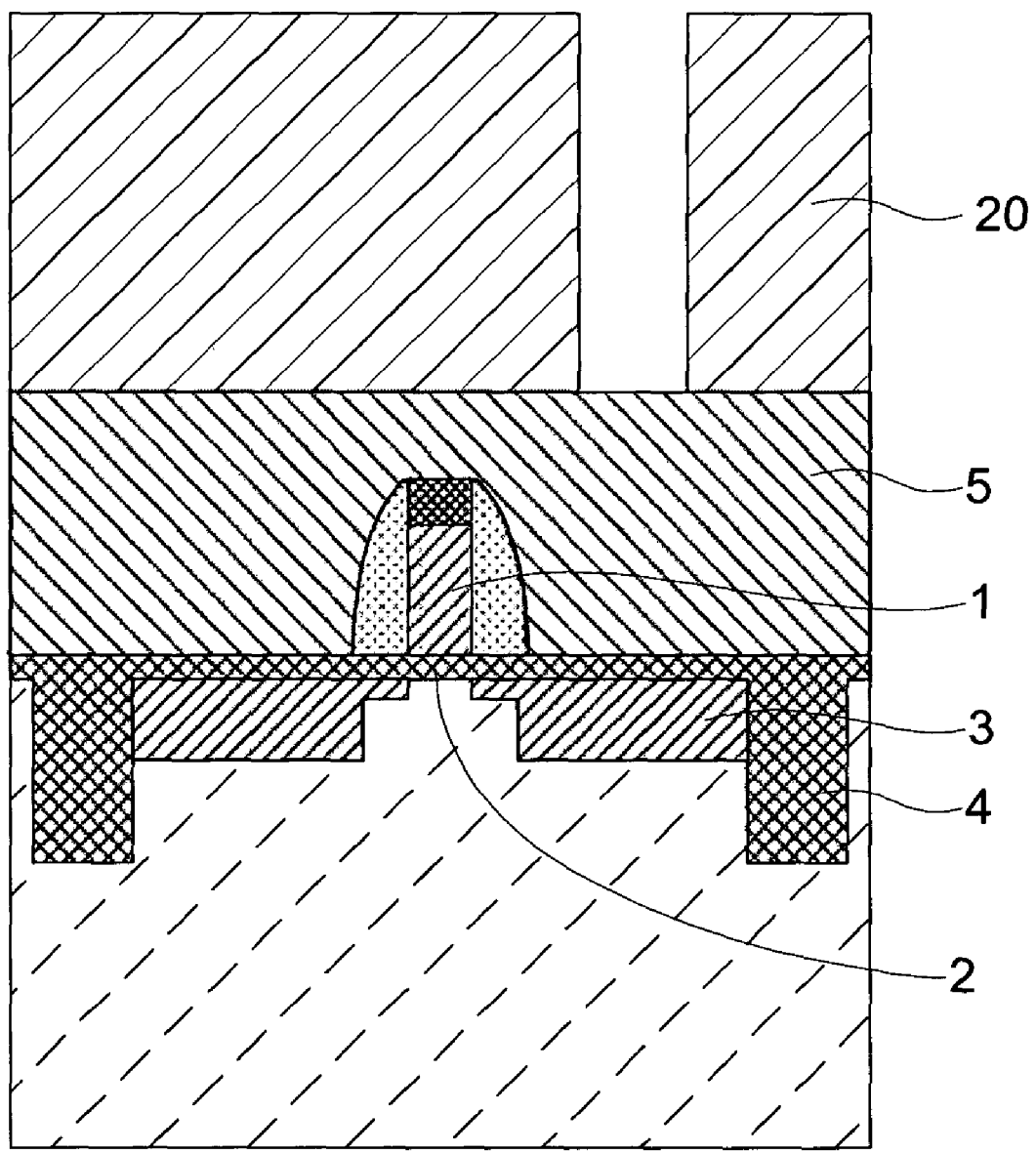
FIG. 4 is a schematic diagram for explaining an example of a state in which the resist pattern smoothing material shown in FIG. 3 is developed and the surface of the resist pattern is smoothed.

As shown in FIG. 2, resist pattern smoothing material "8" is applied onto the surface of the resist pattern "6". As shown in FIG. 3, mixing (containing) of the resist pattern smoothing material "8" into the resist pattern "6" occurs at the boundary surface of the resist pattern "6" and the resist pattern smoothing material "8", so that mixing layers "9" and "10" are formed. Then, when developing is carried out and the resist pattern smoothing material "8" which has not crosslinked is removed, a smoothed resist pattern "20" is formed.

The resist pattern formed by the method of forming a resist pattern of the present invention is suitable for contact holes, openings for T gate electrodes, and the like. The resist pattern can be suitably used in the manufacturing of functional parts such as mask patterns, reticle patterns, magnetic heads, LCDs (liquid crystal displays), PDPs (plasma display panels), SAW filters (surface acoustic wave filters), and the like; optical parts used in connecting optical wiring; fine parts such as microactuators and the like; semiconductors; and the like. The resist pattern can be particularly preferably used in the method of manufacturing a semiconductor device of the present invention which will be described hereinafter.

Method of Manufacturing Semiconductor Device

The method of manufacturing a semiconductor device of the present invention includes a step of forming a resist pattern over a base layer (this step may be referred as a "resist pattern forming step" hereinafter); a step of applying a resist pattern smoothing material onto a surface of the resist pattern, thereafter heating and developing the resist pattern applied with the resist pattern smoothing material so as to form a smoothed resist pattern (this step may be referred as a "resist pattern smoothing step" hereinafter); and a step of etching the base layer the smoothed resist pattern as a mask so as to form a pattern of the base layer (this step may be referred as a "patterning step" hereinafter). In the resist pattern smoothing step, at least one of an application thickness of the resist pattern smoothing material and a heat temperature for the heating is adjusted so as to smooth at least wall surfaces of the resist pattern. Further, the method of manufacturing a semiconductor device may, as needed, include other steps which are appropriately selected.

The method of forming the resist pattern in the resist pattern forming step is not particularly limited, and can be carried out in accordance with any known methods in the art.

The resist pattern smoothing step is a step of forming the resist pattern being smoothed the surface thereof by the aforementioned method of forming the resist pattern. Specifically, the resist pattern smoothing step is a step in which applying the resist pattern smoothing material onto the resist pattern formed in the resist pattern forming step so as to cover the surface of the resist pattern, and heating and developing, in order to smooth at least the wall surfaces of the resist pattern.

In the present invention, the resist pattern smoothing step is particularly preferably carried out by the above-described method of forming a resist pattern of the present invention.

Examples of the base layer are surface layers of various members in semiconductor devices. Preferable examples are substrates such as silicon wafers, various types of oxide films, and the like. The method of application is as described above. After application, it is preferable to carry out the above-described pre-baking, crosslinking baking and the like.

The patterning step is a step of patterning the base layer (e.g., the wiring layer) by carrying out etching (dry etching or the like) using the smoothed resist pattern which was formed by the smoothed resist pattern smoothing step, as a mask.

The method of etching is not particularly limited, and can be appropriately selected from any known methods in the art, in accordance with the object. A suitable example is a dry etching. The etching conditions are not particularly limited, and can be appropriately selected in accordance with the object.

Suitable examples of the other steps are a developing step and the like.

The developing step is a step of carrying out developing after the smoothed resist pattern forming step and before the patterning step. The developing is carried out as described above.

In accordance with the method of manufacturing the semiconductor device of the present invention, it is possible to efficiently manufacture various types of high-performance semiconductor devices such as flash memories, DRAMs, FRAMs, and the like.

Hereinafter, concrete Examples of the present invention will be described. However, the present invention is not limited to these Examples.

EXAMPLE 1

An ArF resist was applied onto a silicon wafer (a base layer). Selective exposure was carried out by using an ArF exposure device and developing was carried out, so as to form a resist pattern (hole pattern) (opening dimension=100 nm).

Next, a resist pattern smoothing material having the following composition was applied onto the surface of the resist pattern. Namely, the resist pattern smoothing material contained 16 parts by mass of polyvinyl acetal resin (KW-3, manufactured by Sekisui Chemical Co., Ltd.) as the resin, 1.16 parts by mass of tetramethoxymethyl glycol uril (manufactured by Sekisui Chemical Co., Ltd.) as the crosslinking agent, and 0.25 parts by mass of a polyoxyethylene monoalkylether surfactant (TN-80, a non-ionic surfactant manufactured by Asahi Denka Co., Ltd.) as the surfactant. Further, a mixed liquid of pure water (deionized water) and isopropyl alcohol (whose mass ratio was pure water (deionized water):isopropyl alcohol=98.6:0.4) was used as the main solvent component other than the resin, the crosslinking agent and the surfactant.

Next, after heating was carried out for the time and temperature shown in Table 1, developing was carried out, and a smoothed resist pattern was formed.

Here, with the opening dimension D of the resist pattern being D=100 nm, the ratio (%) of the maximum opening dimension Dmax (nm) and the minimum opening dimension Dmin (nm) of the resist pattern whose wall surfaces were smoothed was measured, and was evaluated as the edge roughness.

Further, the ratio of the average opening dimension Dav. (nm) of the resist pattern whose wall surfaces were smoothed, with respect to D, was measured, and was evaluated as the amount of variation in pattern size.

The results are shown in Table 1.

TABLE 1

| temperature for heating (baking) | time for heating (baking) | amount of variation in size nm | edge roughness (nm) |
|---|---|---|---|
| none | none | none | 9.2 |
| 90° C. | 60 seconds | 0 | 8.5 |
| 100° C. | 60 seconds | −5 | 4 |
| 105° C. | 60 seconds | −14 | 4.8 |
| 110° C. | 60 seconds | −22 | 3.8 |

TABLE 1-continued

| temperature for heating (baking) | time for heating (baking) | amount of variation in size nm | edge roughness (nm) |
|---|---|---|---|
| 120° C. | 60 seconds | crosslinked over entire surface | — |
| 90° C. | 120 seconds | −4 | 5.2 |
| 110° C. | 30 seconds | −3 | 4.1 |

When the time for heating was 60 seconds, in the case in which the heat temperature was 100° C., as compared with the respective cases in which the temperature for heating was 90° C., 105° C., 110° C., and 120° C., a mixing layer could be formed between the surface of the resist pattern and the resist pattern smoothing material to the extent that the resist pattern was not thickened, and the edge roughness could be reduced and the surface could be smoothed without causing great deformation of or a great variation in the size of the resist pattern. Specifically, it was possible to keep the amount of variation in the pattern size to within a range of ±10% (−5 nm) (i.e., Dav. (nm)≧D (nm)×(90/100) was satisfied), and the edge roughness could be kept to within a range of ±5% (4 nm) (the maximum opening dimension Dmax (nm) and the minimum opening dimension Dmin (nm) were within a range of ±5% with respect to D (nm)).

Further, in the cases in which the times for heating were 120 seconds and 30 seconds and the temperatures for heating were 90° C. and 110° C. respectively, the amount of variation in the pattern size could be kept to within a range of ±10% (−4 nm, −3 nm)) (i.e., Dav. (nm)≧D (nm)×(90/100) was satisfied), and the edge roughness could be kept to within a range of ±5% (5.2 nm, 4.1 nm) (the maximum opening dimension Dmax (nm) and the minimum opening dimension Dmin (nm) were within a range of ±5% with respect to D (nm)).

Next, by using contact holes (a hole pattern) which were a resist extraction pattern formed by the resist pattern which was smoothed as described above, patterning of the silicon substrate (the base layer) was carried out. As a result, a high-performance semiconductor device having a highly detailed pattern was obtained.

Moreover, after a laminated resist was formed on the silicon substrate (the base layer), exposure by an electron beam or the like, and side etching, and the like were carried out in accordance with known methods, and openings for T gate electrodes were formed in the resist film on the silicon substrate (the base layer). In the same way as described above, the resist pattern smoothing material was applied to the resist pattern, in which the openings for T gate electrodes were formed, and heated, and a smoothed resist pattern was formed. Namely, the wall surfaces and the like at the openings for T gate electrodes were smoothed. Next, when electrodes were formed at the openings for T gate electrodes in accordance with a conventional method, a high-performance semiconductor device having highly detailed T gate electrodes (mushroom electrodes) was obtained.

EXAMPLE 2

A smoothed resist pattern was formed in the same way as in Example 1 except that the temperature for heating was made to be 90° C., the time for heating was made to be 60 seconds, and the application thickness of the resist pattern smoothing material was varied as shown in Table 2. The same evaluations as in Example 1 were carried out. The results are shown in Table 2.

TABLE 2

| Application thickness | amount of variation in size (nm) | edge roughness (nm) |
|---|---|---|
| 50 nm | 0 | 8.7 nm |
| 83 nm | −2 | 3.7 nm |
| 98 nm | −12 | 4.1 nm |
| 155 nm | crosslinked over entire surface | — |

When the application thickness were 50 nm, 83 nm, 98 nm, 155 nm and the temperature for heating was 90° C. and the time for heating was 60 seconds, as compared with the cases in which the application thickness were 50 nm, 98 nm and 155 nm, in the case in which the application thickness was 83 nm, the amount of variation in the pattern size could be kept to within a range of ±10% (−2 nm) (i.e., Dav. (nm)≧D (nm)× (90/100) was satisfied), and the edge roughness could be kept to within a range of ±5% (3.7 nm) (the maximum opening dimension Dmax (nm) and the minimum opening dimension Dmin (nm) were within a range of ±5% with respect to D (nm)).

EXAMPLE 3

Figure 5:
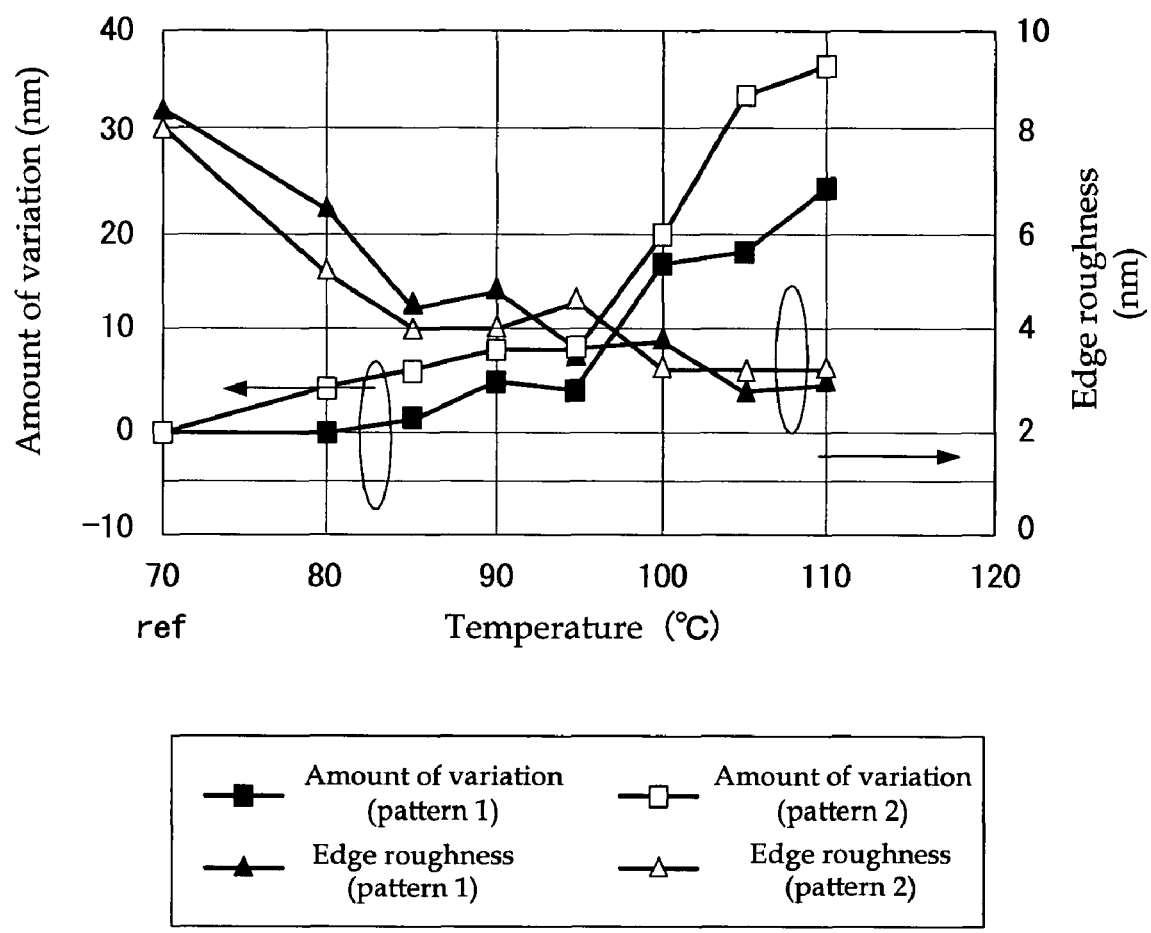
FIG. 5 is a graph of data showing the relationship between a baking temperature of the resist pattern smoothing material, a degree of surface smoothing of the resist pattern and a degree of edge roughness of the smoothed resist pattern.

A smoothed resist pattern was formed in the same way as in Example 1 except that the predetermined opening dimensions of the resist patterns were made to be 120 nm and 150 nm, the temperatures for heating were as shown in Table 3 (for opening dimension=120 nm) and Table 4 (for opening dimension=150 nm), the time for heating was 60 seconds, and the application thickness of the resist pattern smoothing material was 80 nm. The same evaluations as in Example 1 were carried out. The results are shown in Tables 3 and 4 and in FIG. 5.

TABLE 3

| temperature for heating (baking) | amount of variation in size (nm) | edge roughness (nm) |
|---|---|---|
| 80° C. | −1 | 6.4 |
| 85° C. | 1 | 4.4 |
| 90° C. | 5 | 4.8 |
| 95° C. | 4 | 3.4 |
| 100° C. | 17 | 3.9 |
| 105° C. | 18 | 2.8 |
| 110° C. | 25 | 3.1 |
| 120° C. | crosslinked over entire surface | crosslinked over entire surface |

TABLE 4

| temperature for heating (baking) | amount of variation in size (nm) | edge roughness (nm) |
|---|---|---|
| 80° C. | 4 | 5.1 |
| 85° C. | 6 | 4.1 |
| 90° C. | 8 | 4.1 |
| 95° C. | 8 | 4.6 |
| 100° C. | 20 | 3.2 |
| 105° C. | 34 | 3.2 |
| 110° C. | 37 | 3.3 |
| 120° C. | crosslinked over entire surface | crosslinked over entire surface |

When the temperatures for heating were 80° C., 85° C., 90° C., 95° C., 100° C., 105° C., 110° C., and 120° C., in the cases of 80° C. to 95° C., the amount of variation in the pattern size could be kept to within a range of ±10% (i.e., Dav. (nm)≧D (nm)×(90/100) was satisfied), and the edge roughness could be kept to within a range of ±5% (the maximum opening dimension Dmax (nm) and the minimum opening dimension Dmin (nm) were within a range of ±5% with respect to D (nm)).

In accordance with the present invention, it is possible to overcome the drawbacks of the conventional art, and to provide a method of forming a resist pattern in which it is possible to easily and efficiently form a resist pattern whose wall surfaces are smoothed, by applying a resist pattern smoothing material onto the surface of the resist pattern and smoothing the wall surfaces of the resist pattern without resulting in great deformation of or great variations in the size of the resist pattern and without adversely affecting the resist pattern, and to provide a method of manufacturing a semiconductor device which can efficiently manufacture a high-performance semiconductor device by carrying out highly detailed patterning by using a resist pattern which has been obtained by the aforementioned method of forming a resist pattern and whose wall surfaces have been smoothed.

What is claimed is:

1. A method of manufacturing a semiconductor device comprising:
   forming a resist film over a base layer;
   exposing a first area of the resist film and developing the exposed resist film to form a resist pattern including an opening in the first area of the resist film;
   forming a resist pattern smoothing material onto a surface of the resist pattern, thereafter heating and developing the resist pattern so as to form a smoothed resist pattern; and
   etching the base layer using the smoothed resist pattern as a mask so as to form a pattern of the base layer,
   wherein the resist pattern smoothing material comprises at least one of cationic surfactants and amphoteric surfactants,
   wherein at least one of an application thickness of the resist pattern smoothing material and a heat temperature for the heating is adjusted in the range of 70 nm to 90 nm in thickness and in the range of 80° C. to 95° C. in temperature so as to smooth at least wall surfaces of the resist pattern,
   wherein a maximum opening dimension Dmax (nm) and a minimum opening dimension Dmin (nm) of the smoothed resist pattern are within a range of ±5% with respect to a predetermined opening dimension D (nm) of the opening,
   wherein the predetermined opening dimension D (nm), and an average opening dimension Dav. (nm) of the smoothed resist pattern having the wall surfaces which have been smoothed satisfy the relation expressed by:

$Dav.(nm) > D(nm) \times (90/100)$, and wherein the application thickness of the resist pattern smoothing material is within a range of 70 nm to 100 nm.

2. A method of manufacturing a semiconductor device according to claim 1, wherein the maximum opening dimension Dmax (nm) and the minimum opening dimension Dmin (nm) of the smoothed resist pattern are within a range of ±3% with respect to the predetermined opening dimension D (nm) of the resist pattern.

3. A method of manufacturing a semiconductor device according to claim 1, wherein the predetermined opening dimension D (nm) of the resist pattern, and the average opening dimension Dav. (nm) of the smoothed resist pattern satisfy the relation expressed by:

$Dav.(nm) > D(nm) \times (95/100)$.

4. A method of manufacturing a semiconductor device according to claim 1, wherein the resist pattern is formed of an ArF resist.

5. A method of manufacturing a semiconductor device according to claim 1, wherein the heat temperature is within a range of 80° C. to 100° C.

6. A method of manufacturing a semiconductor device according To claim 1 wherein the resist pattern smoothing material comprises a resin and a crosslinking agent.

7. A method of manufacturing a semiconductor device according to claim 6, wherein the resist pattern smoothing material has one of water-solubility and alkali-solubility.

8. A method of manufacturing a semiconductor device according to claim 6, wherein the resin is at least one of polyvinyl alcohol, polyvinyl acetal, and polyvinyl acetate.

9. A method of manufacturing a semiconductor device according to claim 6, wherein the crosslinking agent is at least one of melamine derivative, urea derivative, and uril derivative.

10. A method of manufacturing a semiconductor device according to claim 6, wherein the resist pattern smoothing material further comprises one of a water-soluble aromatic compound and a resin having an aromatic compound in a portion thereof.

11. A method of manufacturing a semiconductor device according to claim 10, wherein the water-soluble aromatic compound is one of polyphenol compound, aromatic carboxylic acid compound, naphthalene polyhydric alcohol compound, benzophenone compound, flavonoid compound, and glycosides thereof, and the resin containing an aromatic compound in a portion thereof is one of polyvinyl aryl acetal resin, polyvinyl aryl ether resin, and polyvinyl aryl ester resin.

12. A method of manufacturing a semiconductor device according to claim 6, wherein the resist pattern smoothing material further comprises an organic solvent.

13. A method of manufacturing a semiconductor device according to claim 12, wherein the organic solvent is at least one of alcohol solvent, chain ester solvent, cyclic ester solvent, ketone solvent, chain ether solvent, and cyclic ether solvent.

14. A method for manufacturing a semiconductor device comprising:
   forming a resist film over a base layer;
   exposing a first area of the resist film and developing the exposed resist film to form a resist pattern including an opening in the first area of the resist film;
   forming a resist pattern smoothing material onto a surface of the resist pattern, thereafter heating and developing the resist pattern so as to form a smoothed resist pattern; and
   etching the base layer using the smoothed resist pattern as a mask so as to form a pattern of the base layer,
   wherein the resist pattern smoothing material comprises polyoxyethylene monoalkylether surfactant,
   wherein at least one of an application thickness of the resist pattern smoothing material and a heat temperature for the heating is adjusted in the range of 70 nm to 90 nm in thickness and in the range of 80° C. to 95° C. in temperature so as to smooth at least wall surfaces of the resist pattern, wherein a maximum opening dimension Dmax (nm) and a minimum opening dimension Dmin (nm) of the smoothed resist pattern are within a range of ±5% with respect to a predetermined opening dimension D (nm) of the opening, wherein the predetermined opening dimension D (nm), and an average opening dimension Dav. (nm) of the smoothed resist pattern having the wall surfaces which have been smoothed satisfy the relation expressed by:

$$Dav.(nm) > D(nm) \times (90/100), \text{ and}$$

wherein the application thickness of the resist pattern smoothing material is within a range of 70 nm to 100 nm.

15. A method of manufacturing a semiconductor device according to claim 14, wherein the maximum opening dimension Dmax (nm) and the minimum opening dimension Dmin (nm) of the smoothed resist pattern are within a range of ±3% with respect to the predetermined opening dimension D (nm) of the resist pattern.

16. A method of manufacturing a semiconductor device according to claim 14, wherein the predetermined opening dimension D (nm) of the resist pattern, and the average opening dimension Dav. (nm) of the smoothed resist pattern satisfy the relation expressed by:

$$Dav.(nm) > D(nm) \times (95/100).$$

17. A method of manufacturing a semiconductor device according to claim 14, wherein the resist pattern is formed of an ArF resist.

18. A method of manufacturing a semiconductor device comprising:

forming a resist film over a base layer;

exposing a first area of the resist film and developing the exposed resist film to form a resist pattern including an opening in the first area of the resist film;

forming a resist pattern smoothing material onto a surface of the resist pattern, thereafter heating and developing the resist pattern so as to form a smoothed resist pattern; and etching the base layer using the smoothed resist pattern as a mask so as to form a pattern of the base layer, wherein the resist pattern smoothing material comprises at least one of cationic surfactants and amphoteric surfactants, wherein an application thickness of the resist pattern smoothing material is adjusted in the range of 70 nm to 90 nm in thickness and a heat temperature for the heating is adjusted in the range of 80° C. to 95° C. in temperature so as to smooth at least wall surfaces of the resist pattern, wherein a maximum opening dimension Dmax (nm) and a minimum opening dimension Dmin (nm) of the smoothed resist pattern are within a range of ±5% with respect to a predetermined opening dimension D (nm) of the opening, and wherein the predetermined opening dimension D (nm), and an average opening dimension Dav. (nm) of the smoothed resist pattern having the wall surfaces which have been smoothed satisfy the relation expressed by:

$$Dav.(nm) > D(nm) \times (90/100).$$

* * * * *